(12) United States Patent
Makinwa et al.

(10) Patent No.: US 9,276,792 B1
(45) Date of Patent: Mar. 1, 2016

(54) PHASE-DOMAIN DIGITIZER

(71) Applicant: Stichting voor de Technische Wetenschappen, Utrecht (NL)

(72) Inventors: Kofi A. A. Makinwa, Delft (NL); Rui Quan, Eindhoven (NL)

(73) Assignee: Stiching Vour de Technische Wetenschappen, Utrecht (NL)

( * ) Notice: Subject to any disclaimer, the term of this patent is extended or adjusted under 35 U.S.C. 154(b) by 0 days.

(21) Appl. No.: 14/544,841

(22) Filed: Feb. 24, 2015

Related U.S. Application Data

(60) Provisional application No. 62/071,289, filed on Sep. 20, 2014.

(51) Int. Cl.
*H04L 27/00* (2006.01)
*H04L 27/233* (2006.01)
*H04L 7/00* (2006.01)

(52) U.S. Cl.
CPC .......... *H04L 27/2338* (2013.01); *H04L 7/0087* (2013.01); *H04L 27/2334* (2013.01)

(58) Field of Classification Search
CPC ....... H03L 7/07; H03L 7/1976; H03L 7/0996; H03L 7/16; H03L 7/0812; H03L 7/0995; H03M 3/368; H03F 2200/331; H04L 2027/0067; H04L 27/0014

USPC .................................................. 375/316, 326
See application file for complete search history.

(56) References Cited

U.S. PATENT DOCUMENTS

| | | | | |
|---|---|---|---|---|
| 2006/0164132 | A1* | 7/2006 | Martin | H03L 7/081 327/105 |
| 2008/0008067 | A1* | 1/2008 | Arisaka | G11B 20/10009 369/47.27 |
| 2008/0267337 | A1* | 10/2008 | Itri | H03L 7/197 375/376 |

* cited by examiner

*Primary Examiner* — Tesfaldet Bocure
(74) *Attorney, Agent, or Firm* — Steven Stupp

(57) ABSTRACT

A phase-domain delta-sigma ($\Delta\Sigma$) modulator in a phase digitizer determines a demodulated phase error based on a phase-modulated frequency signal, in which a carrier frequency is modulated with a fundamental frequency and an associated phase, and a selected one of a set of reference signals, where the demodulated phase error represents a difference between the phase and a reference phase of the selected one of the set of reference signals. Moreover, a digital filter in the phase-domain $\Delta\Sigma$ modulator filters the demodulated phase error. Furthermore, a latch in the phase-domain $\Delta\Sigma$ modulator provides a bit stream by sampling one or more bits of the filtered demodulated phase error, where an average value of the bit stream represents the phase. Next, control logic in the phase-domain $\Delta\Sigma$ modulator selects the one of the set of reference signals.

20 Claims, 11 Drawing Sheets

PHASE-DOMAIN DIGITIZER

CROSS REFERENCE TO RELATED APPLICATION

This application claims priority under 35 U.S.C. §119(e) to U.S. Provisional Application Ser. No. 62/071,289, entitled "All-Digital Phase-Domain Digitizer," by Kofi A. A. Makinwa and Rui Quan, filed on Sep. 20, 2014, the contents of which is herein incorporated by reference.

FIELD OF THE INVENTION

The present disclosure relates generally to phase digitizers.

BACKGROUND

Because of their small size, low cost, ease of use and digital output, integrated temperature sensors are widely used. These integrated temperature sensors are often based on the temperature dependence of bipolar transistors (BJTs). However, because BJTs are sensitive to process spread, their untrimmed inaccuracy is typically limited to a few degrees Celsius. While the inaccuracy of BJTs can be improved by trimming individual devices, this usually increases production test time and the device cost. Furthermore, in advanced deep-submicron CMOS technologies (such as those used in state-of-the-art microprocessors), the performance of BJT-based temperature sensors usually deteriorates significantly. For example, temperature errors of up to 5° C. have been reported. This degraded performance is at odds with the increasing need for thermal management (and for integrated temperature sensors) in microprocessors and other very-large-scale integrated circuits (ICs) because of the increasing power density and the increasing number of processing cores in such chips.

Another technique for measuring temperature (T) is via the thermal diffusivity of silicon (D), which has a $T^{1.8}$ temperature dependence. For example, D can be determined by measuring the characteristics of an electrothermal filter (ETF). As shown in FIG. 1, an existing ETF can include a heater and a relative temperature sensor (such as a thermopile) fabricated on the substrate of a silicon chip. In the ETF, power dissipated in the heater generates heat pulses that diffuse through the silicon over a distance (s) between the heater and the temperature sensor, creating temperature fluctuations at the temperature sensor. The time it takes for these pulses to diffuse is a function of absolute temperature or, in other words, the ETF adds a temperature-dependent phase shift ($\phi_{ETF}$) to a signal at a particular frequency. When the heater is driven at a frequency ($f_{drive}$), the temperature sensor output has the same frequency but with a relative phase shift that can be approximated as $$\phi_{ETF} \propto -s\sqrt{\frac{\pi f_{drive}}{D}}.$$

At constant $f_{drive}$, $\phi_{ETF}$ has a near-linear $T^{0.9}$ temperature dependence. Therefore, by digitizing the time delay associated with diffusion of the heat pulses, ETFs can be used as temperature sensors. Note that microprocessors typically operate at well-defined clock frequencies, so that a known $f_{drive}$ is usually available in these applications.

In contrast to BJTs, ETFs usually do not require trimming because, for IC-grade silicon, D is well-defined and the distance between the heater and the relative temperature sensor is typically accurately determined by lithography. As a consequence, the inaccuracy of an ETF-based temperature sensor scales with the critical dimension of the lithographic process used. For example, ETFs with identical geometry have achieved untrimmed inaccuracies of ±0.7° C. (3σ) and ±0.2° C. (3σ) in 0.7 μm and 0.18 μm CMOS, respectively, indicating that the dominant source of error is lithographic spread. Therefore, the performance of ETFs is expected to improve greatly in modern microprocessors, which are implemented in even more advanced deep-submicron CMOS processes. Furthermore, because D is only weakly sensitive to doping fluctuations at the doping levels typically used in IC technology, the variation between wafers and process lots is small.

The availability of a known driving frequency together with the scaling properties of ETFs make them a promising alternative to current thermal management solutions in modern microprocessors. However, because of power-consumption constraints, the amount of power dissipated in the heater of an ETF is typically limited. In conjunction with the high thermal conductivity of silicon, this power-dissipation constraint leads to small signals at the output of the temperature sensor. Therefore, a precision readout interface is usually needed to extract $\phi_{ETF}$ (and, thus, temperature information) from these small signals.

FIG. 2 illustrates an existing system that includes a phase-detection circuit. In this circuit, the ETF is driven at a constant frequency $f_{drive}$ (which may be obtained from a digital system clock), and its phase-shifted output is multiplied with a reference signal at the same frequency but having a controlled phase shift ($\phi_{demod}$). Furthermore, the DC component of the multiplier output is proportional to the cosine of $\phi_{demod} - \phi_{ETF}$. The integrator in the phase-detection circuit in FIG. 2 drives the phase-shift controller so that this DC component becomes zero, which corresponds to a fixed 90° difference between the two phase shifts. As a consequence, this feedback loop functions as a narrowband and, therefore, low-noise, phase detector. While FIG. 2 includes a sine-wave drive, $f_{drive}$ can be associated with an arbitrary periodic signal. For example, a square-wave may be used. Note that, because the ETF is a low-pass filter, the amplitude of the higher harmonics of $f_{drive}$ in its output signal will be quite small.

When the feedback loop in the phase-detection circuit is locked, the analog control signal driving the phase shifter is a measure for $\phi_{ETF}$. However, the processing of the signals output by the ETF typically requires them to be digital, and so a phase-domain analog-to-digital converter (ADC) is often used. Such an ADC digitizes the relative phase difference between two signals, both of which are at the same frequency.

As shown in FIG. 3, one way to implement a phase-domain ADC is to replace the analog-controlled phase shifter with a digital one. In this circuit, an n-bit ADC samples the integrator output at a sampling rate $f_{sample}$ (which may be over-sampled for high resolution), and feedback is provided through an n-bit digital phase rotator. However, for high n (for example, more than 12 bits), the implementation of an accurate digital phase rotator or an n-bit ADC is usually non-trivial. Typically, a single-bit phase-domain delta-sigma ADC (PDΔΣ) is easier to implement.

An existing system that includes a single-bit PDΔΣ ADC is illustrated in FIG. 4. This PDΔΣ ADC is a 1-bit implementation of the phase-detection circuit shown in FIG. 3. The two phase shift references, $\phi_0$ and $\phi_1$, are digitally generated square-waves with the same frequency as the input signal and which span the phase-shift input range of interest (for clarity, the fundamental harmonics are indicated in FIG. 4). Moreover, the value of $f_{sample}$ is chosen to be substantially larger than the signal bandwidth, which is referred to as 'oversampling.' In such an oversampled modulator (which is often referred to as a 'delta-sigma modulator'), the quantization error associated with the 1-bit ADC is shifted out of the frequency band of interest through noise shaping, thereby offering high resolution after filtering by an appropriate decimation filter. The digital value obtained at the output of the decimation filter is thus a weighted average of the value of the input signal over the conversion period, and so such delta-sigma ADCs belong to the class of averaging converters. Delta-sigma ADCs are well suited for digitizing narrowband signals with high resolution, as is typically required for sensor interfacing. PDΔΣ ADCs have been successfully used to read out ETFs, achieving effective phase resolutions of up to 16 bits.

Usually, the phase-shift input range of the PDΔΣ ADC is chosen large enough to span the expected range of values for $\phi_{ETF}$ over temperature. For example, $\phi_0$ and $\phi_1$ may be $-45°$ and $+45°$, respectively, so that, as $\phi_{ETF}$ varies from 60° to 100°, the cosine of $\phi_{ETF}-\phi_0-90$ is always positive, while the cosine of $\phi_{ETF}-\phi_1-90$ is always negative. This design choice ensures stable feedback-loop operation. FIG. 5 illustrates the measured ETF phase characteristic.

In many existing phase-domain ADCs there are typically non-idealities associated with the analog implementation of the integrator (loop filter) and the modulator. In particular, an analog integrator has several non-idealities, such as: limited dynamic range, non-linearity and finite DC gain. Moreover, the non-ideal switches used in analog demodulators can introduce charge injection and residual offset. It is increasingly difficult to design such analog circuits in modern nanometer-scale CMOS processes, which are basically optimized for the realization of digital circuits. The main challenges include the low intrinsic gain of the transistors (which often requires the use of complicated multi-stage amplifiers) and the low supply voltages (which reduce dynamic range and signal-to-noise ratio). Consequently, it is increasingly difficult to scale such readout architectures to the nanometer-scale CMOS processes in which large-scale integrated circuits (such as microprocessors) are realized.

Therefore, there is a need for a phase digitizer without the problems listed above.

SUMMARY OF THE INVENTION

One embodiment of the present disclosure relates to a phase digitizer. This phase digitizer includes a first input node that receives a phase-modulated frequency signal having a carrier frequency modulated with a fundamental frequency and an associated phase, where the carrier frequency is greater than the fundamental frequency. Moreover, the phase digitizer includes a phase-domain delta-sigma (ΔΣ) modulator, electrically coupled to the input node, which receives the phase-modulated frequency signal and a set of reference signals, where the set of reference signals have the fundamental frequency, and a given reference signal has an associated reference phase. Furthermore, the phase-domain ΔΣ modulator determines a demodulated phase error based on the phase-modulated frequency signal and a selected one of the set of reference signals, where the demodulated phase error represents a difference between the phase and a reference phase of the selected one of the set of reference signals. Additionally, a digital filter in the phase-domain ΔΣ modulator filters the demodulated phase error, and a latch in the phase-domain ΔΣ modulator provides a bit stream by sampling one or more bits of the filtered demodulated phase error, where an average value of the bit stream represents the phase. Control logic in the phase-domain ΔΣ modulator selects the one of the set of reference signals based on the bit stream.

Note that the phase digitizer may include an oscillator that has a second input node and an output node, which is electrically coupled to the first input node. The second input node may receive an analog signal having the fundamental frequency and the phase. Moreover, the oscillator may output, on the output node, the phase-modulated frequency signal that represents amplitude variations in the analog signal as frequency variations. In particular, the oscillator may include: an amplifier, electrically coupled to the second input node, which receives and amplifies the analog signal; and a current-controlled oscillator (CCO), electrically coupled to the amplifier, which converts the analog signal into the phase-modulated frequency signal and to output the phase-modulated frequency signal on the output node. In some embodiments, the phase digitizer includes a trimming mechanism (such as a digital-to-analog converter or DAC), electrically coupled to the CCO, which provides a trim value that sets the carrier frequency of the CCO. For example, the trimming mechanism may include a current DAC.

Moreover, the phase delay associated with the oscillator may be determined during a calibration operation. In particular, during the calibration operation, a calibration phase-modulated frequency signal having the carrier frequency and modulated by a signal having the fundamental frequency and a predefined phase may be input to the phase digitizer to determine the phase delay. Then, during normal operation of the phase digitizer, the phase delay may be subtracted (e.g., by the control logic) from the average value of the bit stream.

Furthermore, the phase-domain ΔΣ modulator may include an up-down counter. The up-down counter may increment and decrement a counter value of the up-down counter based on the phase-modulated frequency signal and the selected one of the set of reference signals. In particular, after one cycle, the selected one of the set of reference signals, the counter value accumulated by the up-down counter may be proportional to the filtered demodulated phase error.

Alternatively, the oscillator may have the output node and a second output node, where the output node outputs the phase-modulated frequency signal and the second output node outputs an inverted version of the phase-modulated frequency signal. In these embodiments, the phase-domain ΔΣ modulator may include a first up-down counter electrically coupled to the output node so that the first up-down counter is driven by the phase-modulated frequency signal and a second up-down counter electrically coupled to the second output node so that the second up-down counter is driven by the inverted version of the phase-modulated frequency signal. At a given time, the first up-down counter may determine and filter a first component of the demodulated phase error based on the phase-modulated frequency signal and the selected one of the set of reference signals, and second up-down counter may determine and filter a second component of the demodulated phase error based on the inverted version of the phase-modulated frequency signal and the selected one of the set of reference signals. Then, the phase-domain ΔΣ modulator may combine the first component of the demodulated phase error and the second component of the demodulated phase error to determine the demodulated phase error, which may be sampled using the latch to provide the bit stream. Because the first and the second up-down counters are driven anti-phase, at any given time, one of the two up-down counters counts up while the other up-down counter counts down. Consequently, the filtered demodulated phase error may be the digital difference between the states of the two up-down counters.

For example, the oscillator may include a differential amplifier electrically coupled to two CCOs, which are, respectively, electrically coupled to the output node and the second output node. Additionally, the phase digitizer may include: a first trimming mechanism, electrically coupled to a first of the CCOs, which provides a first trim value that sets the carrier frequency of the first of the CCOs; and a second trimming mechanism, electrically coupled to a second of the CCOs, which provides a second trim value that sets the carrier frequency of the second of the CCOs.

Note that the one or more bits of the filtered demodulated phase error that are sampled by the latch may include or are determined from a most-significant bit of the up-down counter. Alternatively, the one or more bits of the filtered demodulated phase error that are sampled by the latch may include or are determined from multiple bits of the up-down counter.

In some embodiments, the control logic has a coarse operating mode and a fine operating mode. During the coarse operating mode, there may be a first difference between first and second reference phases of first and second reference signals in the set of reference signals, which are at different times the selected one of the set of reference signals, and a first estimate of the phase having a first precision may be determined using the phase digitizer. Moreover, during the fine operating mode, there may be a second difference between third and fourth reference phases of third and fourth reference signals in the set of reference signals, which are at different times the selected one of the set of reference signals, and a second estimate of the phase having a second precision may be determined using the phase digitizer. Note that the second difference may be less than the first difference, the third and fourth reference phases may bracket the phase, and the first precision may be less than the second precision.

Moreover, the reference signals in the set of reference signals may include square waves, the demodulated phase error may include a square wave, and/or the phase-modulated frequency signal may include a square wave. Furthermore, the control logic may include a phase-domain digital-to-analog converter (DAC).

Another embodiment provides a system that includes the phase digitizer. For example, the system may include an electrothermal filter (ETF) electrically coupled to the phase digitizer.

Another embodiment provides an electronic device that includes the phase digitizer. For example, the electronic device may include a radio receiver.

Another embodiment provides a method for phase digitizing a phase, which may be performed using the phase digitizer. During operation, the phase digitizer receives the phase-modulated frequency signal having the carrier frequency modulated with the fundamental frequency and the associated phase, where the carrier frequency is greater than the fundamental frequency. Moreover, the phase digitizer receives the set of reference signals, where the set of reference signals have the fundamental frequency, and wherein the given reference signal has the associated reference phase. Then, a phase-domain delta-sigma ($\Delta\Sigma$) modulator in the phase digitizer determines the demodulated phase error based on the phase-modulated frequency signal and the selected one of the set of reference signals, where the demodulated phase error represents the difference between the phase and the reference phase of the selected one of the set of reference signals. Furthermore, the digital filter in the phase-domain $\Delta\Sigma$ modulator filters the demodulated phase error, and the latch in the phase-domain $\Delta\Sigma$ modulator provides the bit stream by sampling one or more bits of the filtered demodulated phase error, where the average value of the bit stream represents the phase. Next, the control logic in the phase-domain $\Delta\Sigma$ modulator selects the one of the set of reference signals based on the bit stream.

Another embodiment provides a second phase digitizer. The second phase digitizer includes the ETF that is driven by a drive signal having the fundamental frequency, and that outputs the analog signal. Moreover, second phase digitizer includes the oscillator that receives the analog signal and outputs the phase-modulated frequency signal that represents the amplitude variations in the analog signal as the frequency variations. Furthermore, the second phase digitizer includes the phase-domain delta-sigma ($\Delta\Sigma$) modulator, electrically coupled to the oscillator, which: receives the phase-modulated frequency signal and has a second reference signal having the fundamental frequency; determines the demodulated phase error based on the phase-modulated frequency signal and the second reference signal; and digitizes the phase by filtering the demodulated phase error. The phase-domain $\Delta\Sigma$ modulator includes the latch that provides the bit stream by sampling the one or more bits of the filtered demodulated phase error. Additionally, the phase-domain $\Delta\Sigma$ modulator includes the control logic, electrically coupled to the latch, which provides the reference signal based on the bit stream.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

Note that like reference numerals refer to corresponding parts throughout the drawings. Moreover, multiple instances of the same part are designated by a common prefix separated from an instance number by a dash.

DETAILED DESCRIPTION

Figure 1:
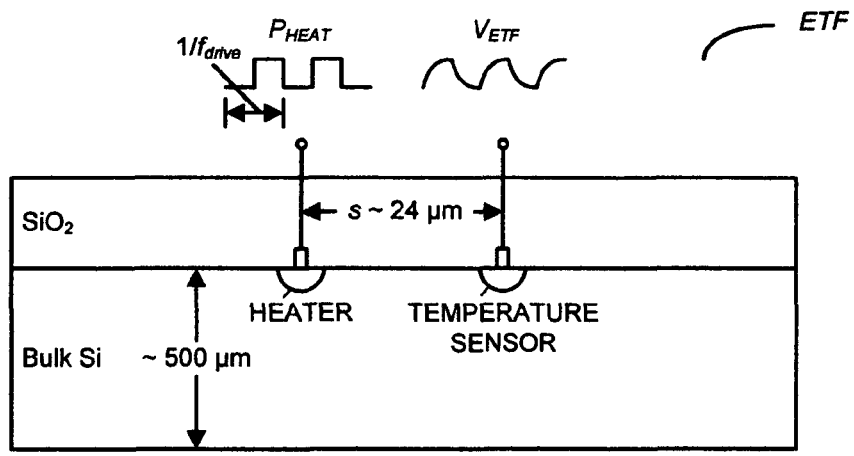
FIG. 1 is a drawing illustrating an existing electrothermal filter (ETF) implemented on a silicon substrate.
Figure 2:
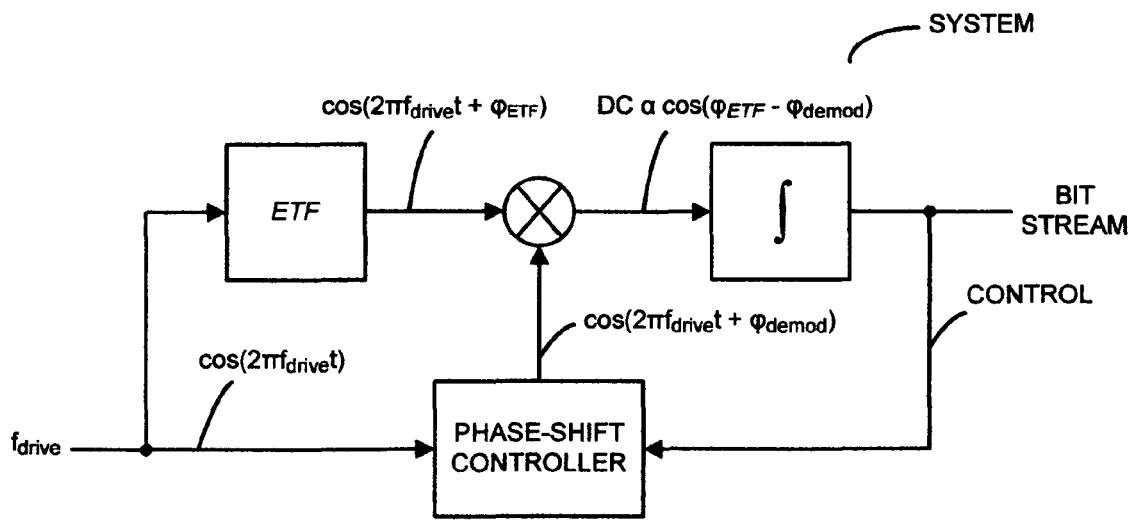
FIG. 2 is a block diagram illustrating an existing system that includes an ETF and a phase-detection circuit.
Figure 3:
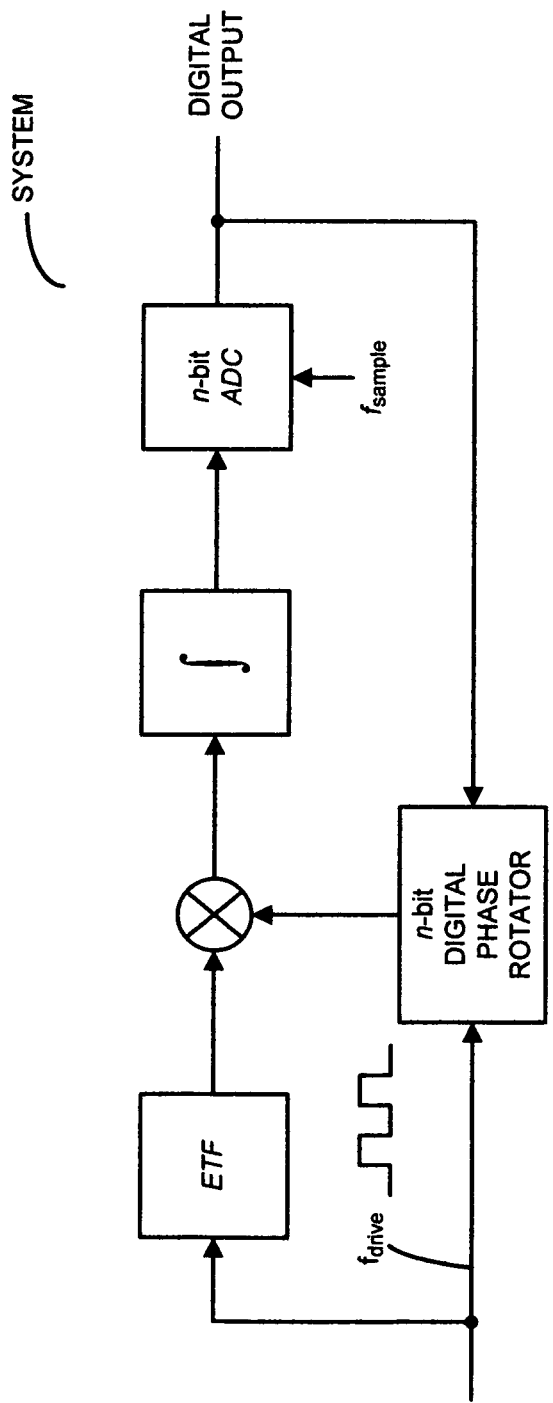
FIG. 3 is a block diagram illustrating an existing system that includes an ETF and a phase-detection circuit.
Figure 4:
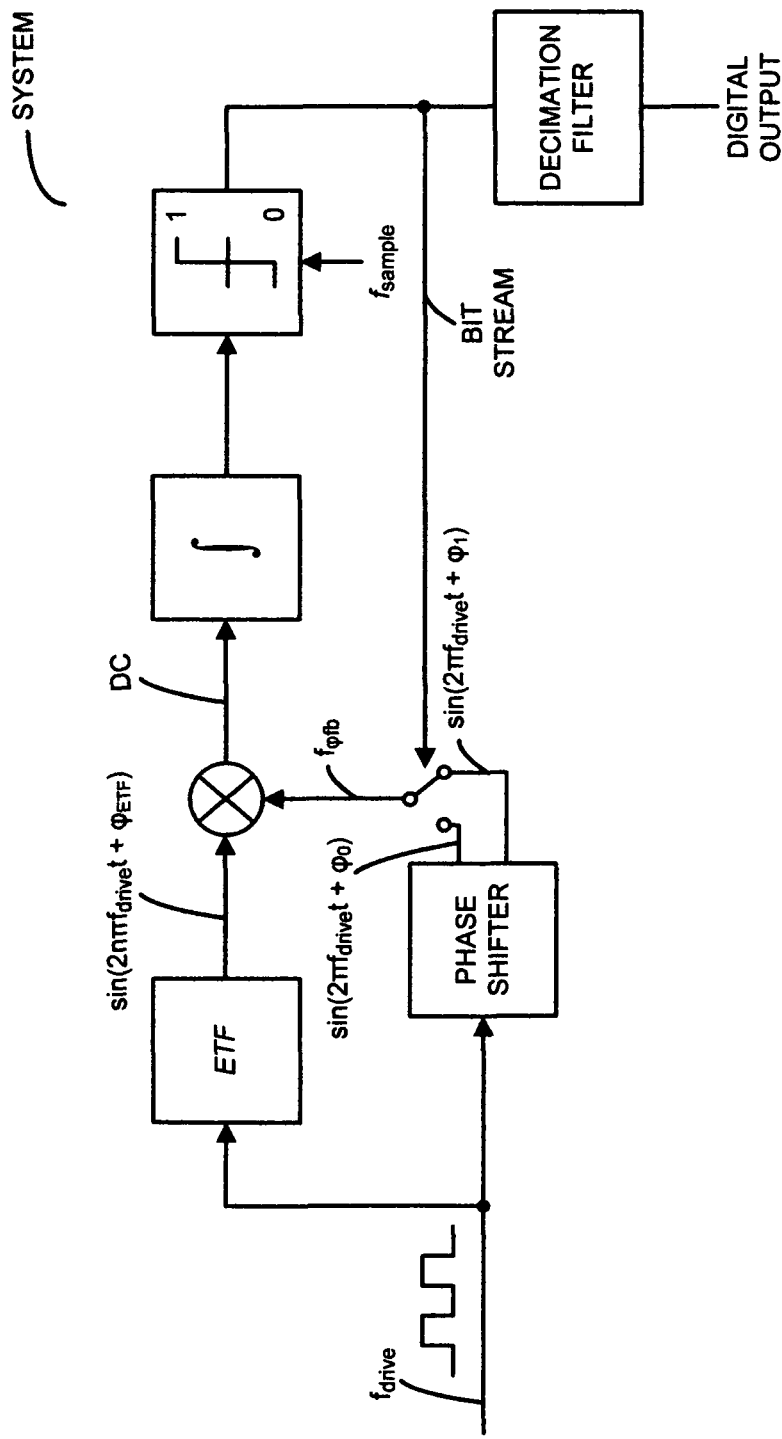
FIG. 4 is a block diagram illustrating an existing system that includes an ETF and a phase-domain delta-sigma (PD$\Delta\Sigma$) analog-to-digital converter (ADC).
Figure 5:
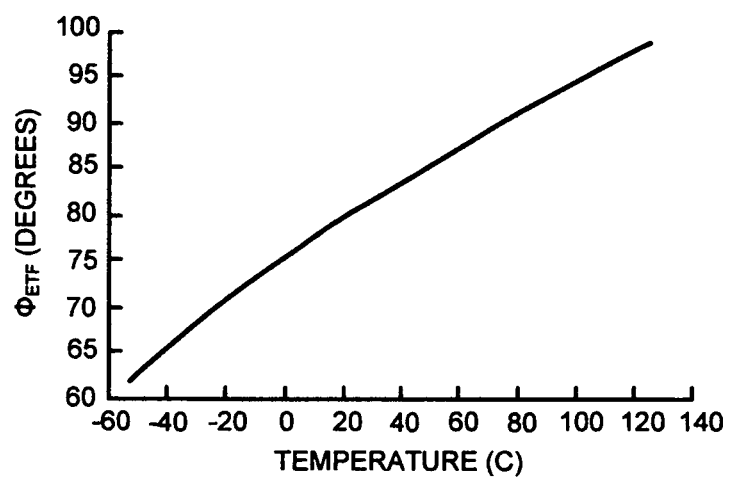
FIG. 5 is a graph illustrating a measured ETF phase characteristic of the PD$\Delta\Sigma$ADC in FIG. 4.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Embodiments of a phase digitizer, a system that includes the phase digitizer and an electrothermal filter (ETF), an electronic device that includes the phase digitizer, and a method for phase digitizing a phase are described. In the phase digitizer, a phase-domain delta-sigma ($\Delta\Sigma$) modulator determines a demodulated phase error based on a phase-modulated frequency signal, in which a carrier frequency is modulated with a fundamental frequency and an associated phase, and a selected one of a set of reference signals, where the demodulated phase error represents a difference between the phase and a reference phase of the selected one of the set of reference signals. Moreover, a digital filter in the phase-domain $\Delta\Sigma$ modulator filters the demodulated phase error. Furthermore, a latch in the phase-domain $\Delta\Sigma$ modulator provides a bit stream by sampling one or more bits of the filtered demodulated phase error, where an average value of the bit stream represents the phase (and, thus, may be an output of the phase digitizer). Next, control logic in the phase-domain $\Delta\Sigma$ modulator selects the one of the set of reference signals.

The phase-modulated frequency signal may be a radio signal. Alternatively, the phase-modulated frequency signal may be generated by an oscillator. In particular, the oscillator may convert an analog signal having the fundamental frequency and the phase into the frequency domain, so that amplitude variations (such as voltage variations) in the analog signal are represented as frequency variations. Moreover, the phase digitizer may include a phase-domain delta-sigma ($\Delta\Sigma$) modulator. The phase-domain $\Delta\Sigma$ modulator may include an up-down counter that receives the phase-modulated frequency signal and the set of reference signals may be generated by the control logic (such as a digital phase rotator) in the phase-domain $\Delta\Sigma$ modulator, where the set of reference signals have the fundamental frequency, and a given reference signal has an associated reference phase. The selected one of the set of reference signal may demodulate the phase-modulated frequency signal by controlling incrementing and decrementing of the up-down counter. Furthermore, the up-down counter may digitally filter (such as integrate) the result of the demodulation. The output of the counter may be periodically latched to generate a digital output. Depending on the digital output, the control logic may select the one of the set of reference signals. Note that the average output of the up-down counter may be a digital representation of the phase of the phase-modulated frequency signal.

Because the demodulation in the phase detector (which effectively multiplies the phase-modulated frequency signal and the selected one of the set of reference signals) occurs in the digital domain, the demodulation may be near ideal. Moreover, the digital filtering (which may include integration, but may also include more-sophisticated filtering and, thus, results in a higher-order $\Delta\Sigma$ modulator) also occurs in the digital domain, so that the filter may have infinite DC gain and may have perfect linearity. Consequently, the phase detector may have significantly reduced non-linearity and distortions relative to existing analog phase detectors. Furthermore, the architecture of the phase detector can be readily implemented in modern CMOS processes, which are optimized for digital circuits.

This phase detector may facilitate digitizing of a phase characteristic that is a function of a physical variable, such as the output of a thermal-diffusivity-based temperature sensor. For example, in conjunction with the ETF, the phase detector may be used to implement a highly digital thermal-diffusivity-based temperature sensor with significantly reduced: non-linearity, quantization noise, untrimmed inaccuracy (i.e., high precision) and size. Therefore, the phase detector may facilitate a highly accurate, integrated temperature sensor, which may address long-standing needs in a wide variety of applications.

We now describe embodiments of the phase detector. In general, a phase digitizer is a type of analog to digital converter (ADC) that converts the relative phase-shift of a periodic analog signal with respect to the phase of a periodic reference signal into a digital quantity. Both the analog signal and the reference signal have substantially the same frequency.

Figure 6:
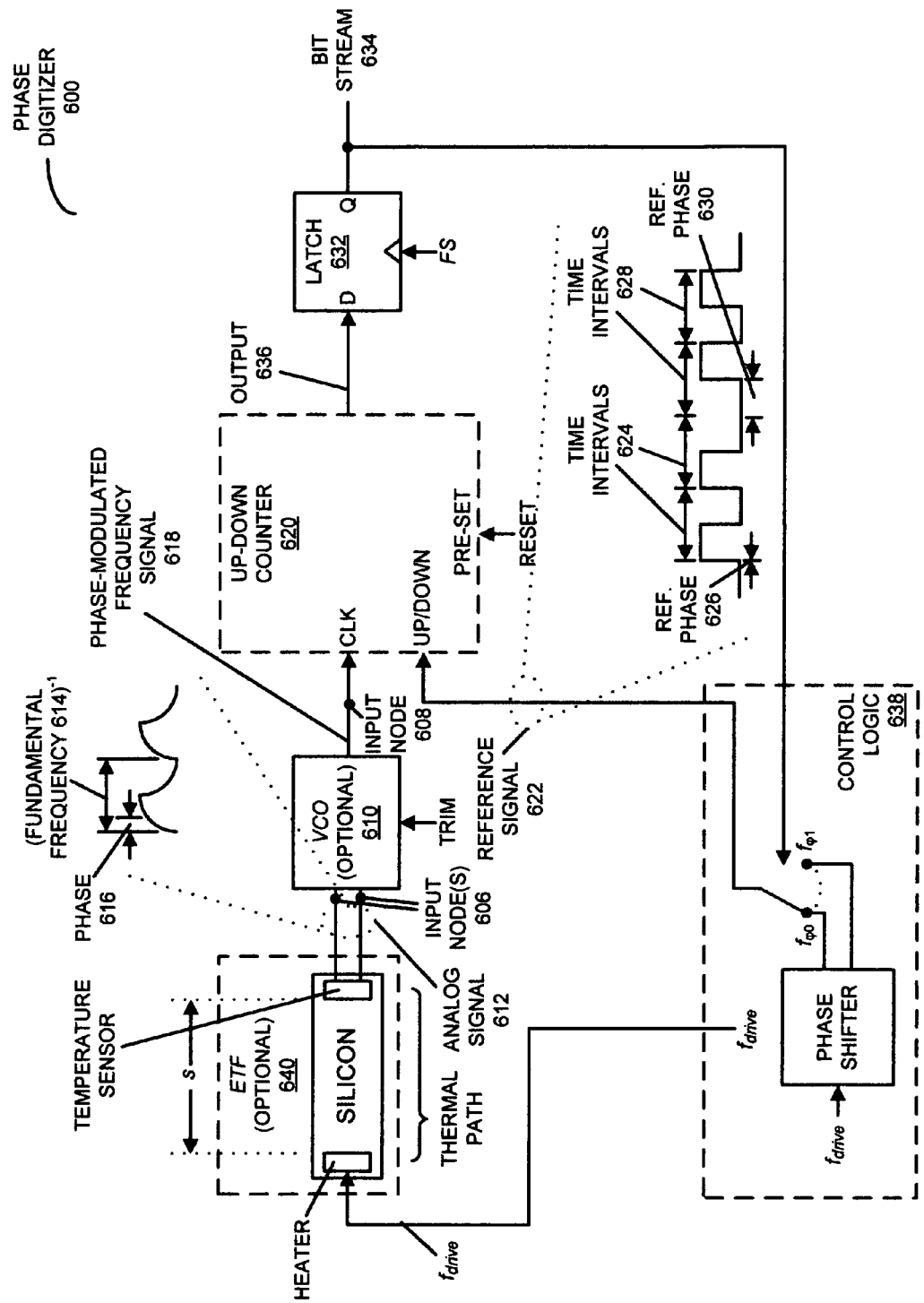
FIG. 6 is a block diagram illustrating a phase digitizer in accordance with an embodiment.

FIG. 6 presents a block diagram illustrating a phase digitizer 600. This phase digitizer may include an optional voltage-controlled oscillator (VCO) 610 (and, more generally, an oscillator) that receives, on input nodes 606, an analog signal 612 having a fundamental frequency 614 and a phase 616, and may output, to input node 608), a phase-modulated frequency signal 618 that represents voltage variations (and, more generally, amplitude variations) in analog signal 612 as frequency variations. In particular, phase-modulated frequency signal 618 may have a carrier frequency modulated with fundamental frequency 614 and phase 616. Alternatively, phase digitizer 600 may receive, on input node 608, phase-modulated frequency signal 618 directly, such as from an antenna (not shown). For example, phase-modulated frequency signal 618 may be a radio signal. In some embodiments, phase-modulated frequency signal 618 includes a square wave.

Moreover, phase digitizer 600 may include a phase-domain delta-sigma (As) modulator (such as a first-order phase-domain $\Delta\Sigma$ modulator) electrically coupled to VCO 610. Such a phase-domain phase digitizer may include a decimation filter that converts the bit-stream output by the $\Delta\Sigma$ modulator into a digital word or value. (Note that a phase digitizer includes a modulator and a decimation or averaging filter.) This decimation filter also restricts the noise bandwidth in the system and so improves the signal-to-noise ratio of the resulting digital value. Note that a higher-order phase-domain $\Delta\Sigma$ modulator (such as an $n^{th}$-order phase-domain $\Delta\Sigma$ modulator) may include n cascaded analog filters (such as integrators) in the loop, where n is greater than one.

However, in order to avoid the problems associated with analog components, phase digitizer 600 may use a digital implementation of the first-order phase-domain $\Delta\Sigma$ modulator, which includes a feedback loop that includes or has components that perform the functions of: a phase detector that generates a signal proportional to the phase difference (or phase error) between an input signal and a feedback phase; more generally, a loop filter or a digital filter that integrates (filters) the phase difference; a quantizer that samples (i.e., digitizes) the output of the integrator (and, more generally, the digital filter); and a phase selector, driven by the output of the quantizer, which selects the instantaneous feedback phase from one or more reference phases. In particular, as shown in FIG. 6, the first-order phase-domain ΔΣ modulator may include an up-down counter 620 (such as an up-down counter having at least 6 bits). This up-down counter may receive phase-modulated frequency signal 618 and a reference signal 622 (selected from a set of reference signals with different reference phases) having fundamental frequency 614. Reference signal 622 may have reference phase 626 ($f_{\phi 0}$) during time intervals 624, and reference phase 630 ($f_{\phi 1}$) during time intervals 628 (i.e., as described further below, control logic 638 and/or phase digitizer 600 may, in a given time interval, select a given reference phase of reference signal 622 or may select a given one of the set of reference signals), where time intervals 628 are interleaved between time intervals 624. Note that a duration of a given one of time intervals 624 may or may not equal a duration of a given one of time intervals 628. As shown in FIG. 6, reference signal 622 may be a square wave. However, in some embodiments reference signal 622 includes a continuous signal (such as a harmonic signal) or a pulsed signal (with pulses at edges that correspond to or defines fundamental frequency 614).

Furthermore, up-down counter 620 may: determine a demodulated phase error based on phase-modulated frequency signal 618 and reference signal 622, where the demodulated phase error represents a difference between phase 616 and a reference phase of reference signal 622; and filters the demodulated phase error in the digital domain. Note that the demodulated phase error may be a square wave. Reference signal 622 may control incrementing and decrementing of a counter value of up-down counter 620 based on phase-modulated frequency signal 618 (i.e., reference signal 622 may be applied to the up-down control input of up-down counter 620). For example, after a cycle with one or more of time intervals 624 and one or more of time intervals 628 (such as at least 50-200 instances of time intervals 624 and 628), the counter value accumulated by up-down counter 620 may be proportional to an filtered demodulated phase error between phase-modulated frequency signal 618 and reference signal 622. While it is convenient, note that up-down counter 620 does not need to be incremented or decremented by +1 and −1, respectively.

Additionally, the phase-domain ΔΣ modulator in phase detector 600 may include: a latch 632 (such as a flip-flop), electrically coupled to up-down counter 620, which provides a bit stream 634 by sampling one or more bits of an output 636 of up-down counter 620 (i.e., by sampling one or more bits of filtered demodulated phase error), where output 636 represents one or more bits of the filtered demodulated phase error, and an average value of bit stream 634 represents phase 616 (and, in particular, a digital representation of phase 616, which therefore may be an output of phase digitizer 600); and control logic 638 (such as a phase-domain digital-to-analog converter or DAC), electrically coupled to latch 632, which provides reference signal 622 based on bit stream 634. In particular, control logic 638 may switch between reference phases 626 and 630 based on bit stream 634. Alternatively, control logic 638 may select one of the set of reference signals as reference signal 622 based on bit stream 634.

Note that output 636 may be a most-significant bit (msb) of up-down counter 620, in which case reference signal 622 may have one of two reference phases. More generally, output 636 of up-down counter 620 that is sampled by latch 632 (at sampling frequency FS, which is less than or equal to fundamental frequency 614) may include (or may be determined from) multiple bits of up-down counter 620, in which case reference signal 622 may have one of more than two reference phases (e.g., if three bits of up-down counter 620 are used, reference signal 622 may have one of eight reference phases).

Thus, more than one of the bits of up-down counter 620 may be used to drive a multi-bit phase DAC in control logic 638, which, in conjunction with other components in FIG. 6, may provide a multi-bit ΔΣ modulator with less quantization noise. Therefore, output 636 may be used to drive a multi-bit DAC. In some embodiments, control logic 638 is electrically coupled to VCO 610, so that control logic 638 samples a state of VCO 610 (such as a state of one or more delay stages in VCO 610). Based on the state of VCO 610 and bit stream 634 (i.e., high-resolution phase information), a multi-bit phase DAC in control logic 638 may provide multiple reference signal to multiple instances of up-down counter 620. This configuration may provide a multi-bit ΔΣ modulator with even higher resolution.

Because of the digital implementation used in phase digitizer 600, the determination of the demodulated phase error occurs in the digital domain and so may be near ideal. In addition, the digital filtering (which may include integration) also occurs in the digital domain and so may have infinite DC gain and may be perfect linearity. Consequently, the aforementioned components in phase digitizer 600 may provide a near-ideal ΔΣ modulator.

In some embodiments, analog signal 612 is provided by a filter having a phase characteristic that is a function of a physical variable. For example, analog signal 612 may be provided by an optional temperature sensor, such as at least one optional ETF 640. In another embodiment, analog signal 612 may be provided by an RC filter, in which either the resistance (R) or the capacitance (C) are functions of a physical variable, such as strain or temperature. In these embodiments, phase digitizer 600 may be used to accurately digitize phase 616 output by optional ETF 640.

In particular, while not shown in FIG. 6, a drive circuit (such as a VCO and, more generally, an oscillator circuit) may provide a drive signal (such as an analog electrical drive signal, which may be a continuous or a pulse signal) having fundamental frequency 614 (which equals $f_{drive}$) to optional ETF 640. In response to the drive signal, optional ETF 640 may output analog signal 612 (such as an analog electrical output signal) having fundamental frequency 614 and phase 616 ($\phi_{ETF}$) relative to the drive signal (i.e., a phase shift) corresponding to a temperature-dependent time constant of optional ETF 640. Furthermore, phase digitizer 600 may measure a phase-shift value of $\phi_{ETF}$ and output a digital value via bit stream 634.

Note that optional ETF 640 may include: a heater (such as an $n^+$-diffusion heater) that receives the drive signal, a thermal (i.e., heat-diffusion) path, and a temperature sensor (such as a $p^+$-diffusion/aluminum thermopile). In optional ETF 640, the thermal path may include a semiconductor (such as silicon) having the temperature-dependent time constant, and the temperature sensor may provide analog signal 612. Moreover, in optional ETF 640 the thermal path may include a material other than the semiconductor (such as an insulator, polysilicon and/or an oxide).

In an exemplary embodiment, a temperature sensor based on phase digitizer 600 (including optional ETF 640) in 0.16 μm CMOS has ±6.5° C. (3σ, no trim) inaccuracy, ±1.5° C. (3σ, single trim) inaccuracy and 0.6° C. rms resolution at a 0.9 kS/s sampling rate over a range from −10 to 125 C. The temperature sensor has a power consumption of 3.6 mW, of which 50% is dissipated in the heater for optional ETF 640 and 40% in up-down counter 620. Moreover, the temperature sensor has an area of 460 μm². Because 70% of the area of the temperature sensor may be occupied by digital circuitry, porting the temperature sensor to, e.g., a 32 nm CMOS process may reduce the digital area by 20× and, thus, may reduce the area of temperature sensor to less than 1650 μm². In another exemplary embodiment, phase detector 600 may be used to implement an electrothermal frequency-locked loop (EFLL) having an inaccuracy below 250 ppm.

Figure 7:
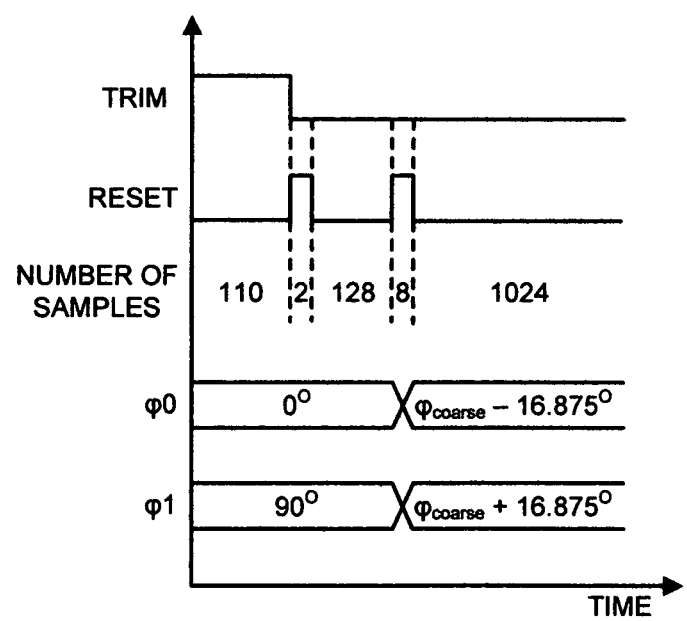
FIG. 7 is a timing diagram illustrating operation of the phase digitizer of FIG. 6 in accordance with an embodiment.

As shown in FIG. 7, which presents a timing diagram illustrating operation of phase digitizer 600 (FIG. 6), in some embodiments control logic 638 performs an incremental two-step zoom conversion, with a coarse operating mode and a fine operating mode. During the coarse operating mode, a difference between reference phases 626 and 630 (FIG. 6) may be 90° (and, more generally, a first phase difference), while a first estimate of phase 616 (FIG. 6) having a coarse precision is determined using phase digitizer 600 (FIG. 6). In addition, during the fine operating mode, reference phases 626 and 630 (FIG. 6) may bracket the first estimate of phase 616 (FIG. 6), with a phase difference less than 90° (and, more generally, with a second phase difference that is less than the first phase difference), while a second estimate of phase 616 (FIG. 6) having a fine precision may be determined using phase digitizer 600 (FIG. 6). Note that the coarse precision is less than the fine precision.

In an exemplary embodiment, a 75 MHz clock (which may be generated by control logic 638 in FIG. 6, which may be the output of a current-controlled oscillator in VCO 610, or which may be an external clock reference provided to phase digitizer 600 in FIG. 6) is used by synchronous digital logic (such as control logic 638 in FIG. 6) to generate a 1.17 MHz ETF drive signal ($f_{drive}$) and two 1.17 MHz reference clocks ($f_{\phi 0}$ and $f_{\phi 1}$) with phase shifts $\phi 0$ and $\phi 1$, respectively (i.e., reference signal 622). Each of these phase-shifts can be independently adjusted in 5.625° steps spanning a phase range of 0 to 90°. During the coarse operating mode, $\phi 0$ and $\phi 1$ may be set to 0 and 90°, respectively, to cover the full temperature range, and a 128-step conversion is used to obtain a 4-bit estimate ($\phi_{coarse}$) of phase 616 (FIG. 6). Then, $\phi 0$ and $\phi 1$ may be set to straddle $\phi_{coarse}$, such that $\phi 1-\phi 0$ equal to 33.75°. A 1024-step (10-bit) fine conversion may be initiated to accurately determine the phase 616 in FIG. 6 ($\phi_{fine}$), in which control logic 638 (FIG. 6) selects $\phi 0$ and $\phi 1$ based on bit stream 634 (e.g., using a look-up table). Note that a full-zoom ADC conversion may involve 1272 clock samples (including 110 samples to trim the carrier frequency of VCO 610 in FIG. 6, which is described further below with reference to FIG. 8) at a sampling rate of 1.17 MHz, resulting in a conversion rate of 0.9 kS/s. (Thus, there is a tradeoff between: the response time of phase digitizer 600 in FIG. 6, $f_{drive}$ and the desired resolution.) Moreover, note that, by using this cascaded (two-step) digitization process, phase digitizer 600 (FIG. 6) may provide high precision and reduced quantization noise. In general, $f_{drive}$ may be increased to generate sufficiently small phase steps or increments, but there may be a tradeoff between: the desired resolution, the power consumption and the digital circuit area.

Figure 8:
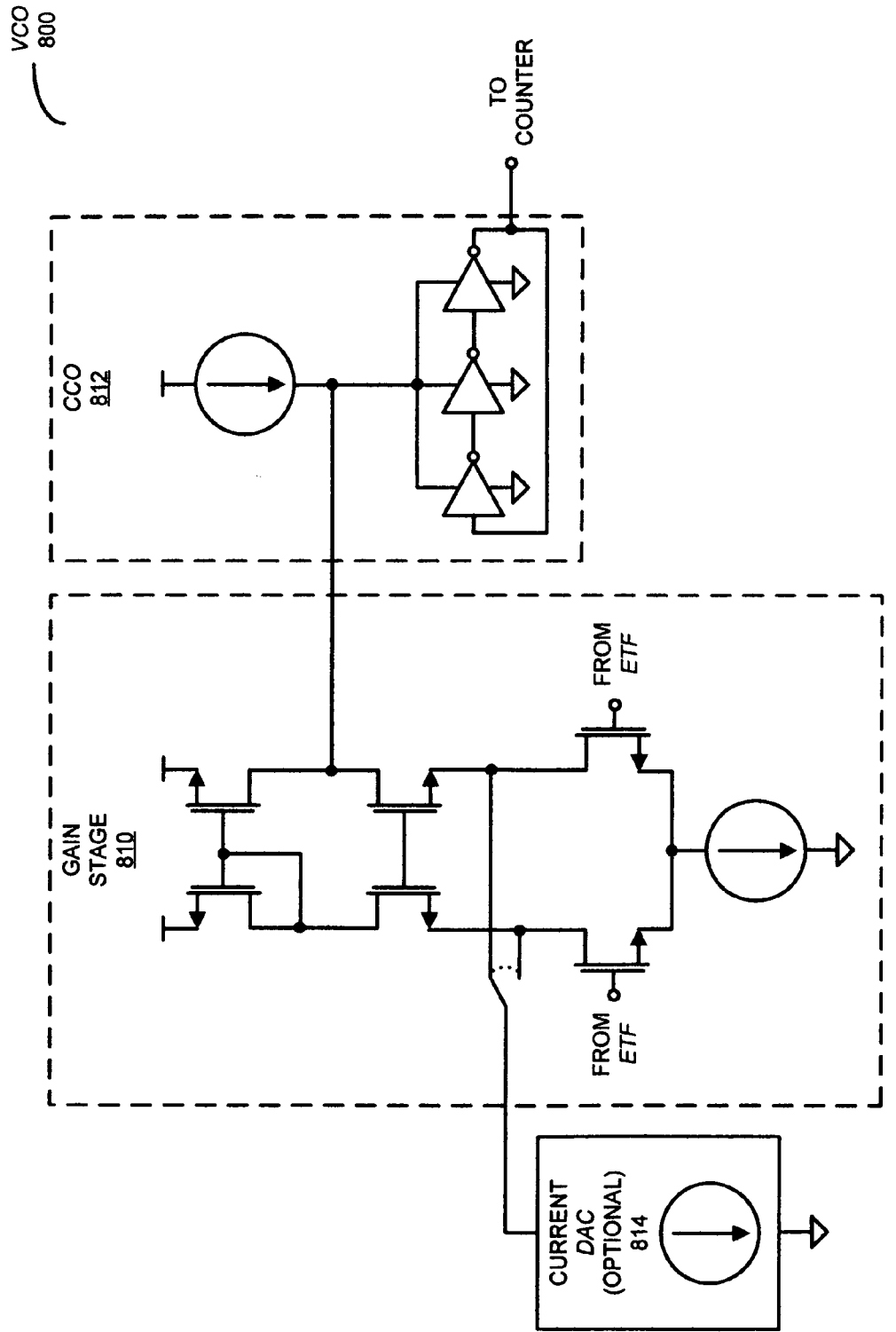
FIG. 8 is a block diagram illustrating a voltage-controlled oscillator (VCO) in the phase digitizer of FIG. 6 in accordance with an embodiment.

FIG. 8 presents a block diagram illustrating a VCO 800 in phase digitizer 600 (FIG. 6). This VCO may include: a gain stage 810 (and, more generally, an amplifier) that receives and amplifies analog signal 612; and a current-controlled oscillator (CCO) 812, electrically coupled to gain stage 810 and up-down counter 620 (FIG. 6), which converts analog signal 612 into phase-modulated frequency signal 618. Because of the digital implementation of up-down counter 620 (FIG. 6), the gain of gain stage 810 may not impact the accuracy of phase digitizer 600 (FIG. 6). Consequently, gain stage 810 may include a differential amplifier with a current-mirror load. However, the phase shift (and spread) of the RC filter formed by the input capacitance of gain stage 810 and the resistance of the thermopile may be indistinguishable from the phase shift of optional ETF 640 (FIG. 6). In order to minimize this effect, the input devices of the single-stage operational transconductance amplifier may have near-minimum size and may use a cascode configuration to reduce the Miller effect.

As shown in FIG. 8, CCO 812 may have a minimum-size 3-stage ring oscillator, which may be optimized for the highest current-to-frequency gain. In some embodiments, phase digitizer 600 (FIG. 6) includes a trimming mechanism, such as optional current DAC 814 (e.g., a 6-bit current DAC), electrically coupled to CCO 812, which provides a trim value that sets the operating point or nominal frequency, i.e., the carrier frequency, of CCO 812. In particular, optional current DAC 814 may be used to trim the offset of gain stage 810 and the spread of CCO 812. This trimming may be performed once, periodically and/or as needed. For example, the trimming may be performed prior to each phase conversion. During the trimming phase, the msb-1 bit of up-down counter 620 (FIG. 6) may be compared to a reference clock (such as reference signal 622 in FIG. 6). Depending on the result, the value of optional current DAC 814 may be updated using a ramp-search technique to fix the carrier frequency of CCO 812 (e.g., to 220 MHz). Although up-down counter 620 (FIG. 6) may be insensitive to variations in the carrier frequency, trimming may ensure that the carrier frequency does not exceed the maximum operating frequency of up-down counter 620 in FIG. 6 (i.e., that phase-modulated frequency signal 618 in FIG. 6 is not too high), or that the carrier frequency does not introduce too much quantization noise (i.e., that phase-modulated frequency signal 618 in FIG. 6 is not too low). In an exemplary embodiment, the supply of the analog section of phase digitizer 600 in FIG. 6 (which includes gain stage 810, CCO 812 and optional current DAC 814) is 1.35 V, while the digital supply is 1.8 V (so that the speed of up-down counter 620 in FIG. 6 is not limited).

Note that the phase delay associated with VCO 800 may be determined during a calibration operation. In particular, during the calibration operation, a calibration phase-modulated frequency signal having the carrier frequency and modulated by a signal having the fundamental frequency and a predefined phase may be input to the phase digitizer to determine the phase delay associated with VCO 800. Then, during normal operation of the phase digitizer, the phase delay associated with VCO 800 may be subtracted (e.g., by control logic 638 in FIG. 6) from the average value of the bit stream.

Figure 9:
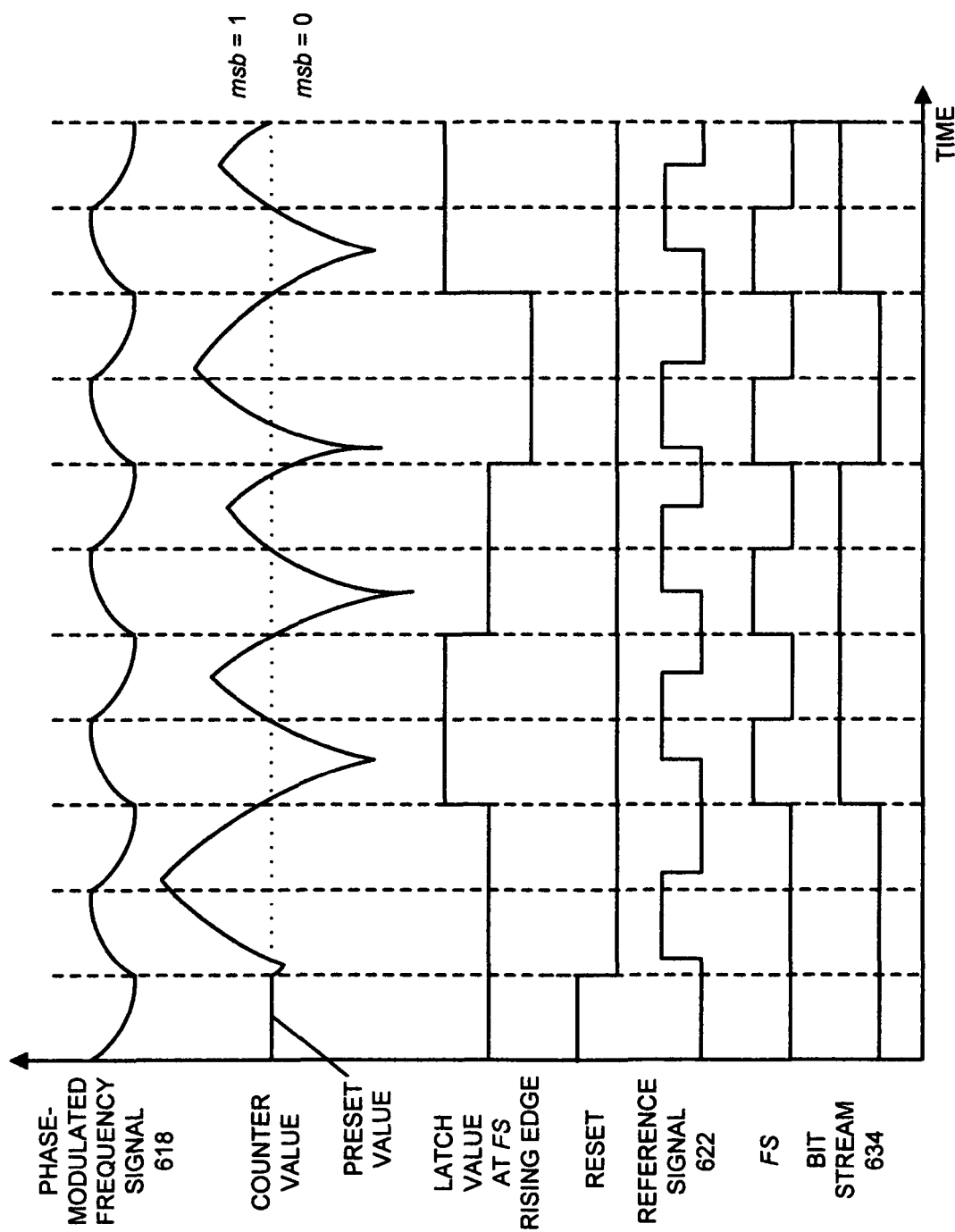
FIG. 9 is a timing diagram illustrating operation of the phase digitizer of FIG. 6 in accordance with an embodiment.

FIG. 9 presents a timing diagram illustrating operation of phase digitizer 600 (FIG. 6) when phase-modulated frequency signal 618 (FIG. 6) is modulated by the output voltage of optional ETF 640 (FIG. 6) at $f_{drive}$. The counter value accumulated by up-down counter 620 (FIG. 6) after one complete up-down cycle may then be proportional to the filtered demodulated phase error between phase-modulated frequency signal 618 and (up-down control) reference signal 622. For example, if phase-modulated frequency signal 618 and reference signal 622 in FIG. 6 are exactly in phase, the counter state may increment (or decrement) steadily, while if their phase-shift is 90° the counter state may remain unchanged because it may be incremented and decremented in exactly the same way during both reference phases 626 and 630 of reference signal 622 (FIG. 6). In particular, if the duty-cycle of reference signal 622 (FIG. 6) is 50% (i.e., if the duration of time intervals 624 equals the duration of time intervals 628), the exact value of the carrier frequency of CCO 812 (FIG. 8) may have no effect on output 636 (FIG. 6). However, in order to minimize the quantization errors in the digitized phase-shift accumulated by up-down counter 620

(FIG. 6), the carrier frequency of CCO 812 (FIG. 8) may be greater than fundamental frequency 614 (FIG. 6).

In an exemplary embodiments, optional ETF 640 (FIG. 6) and gain staged 810 (FIG. 8) are implemented as analog devices, while a remainder of phase digitizer 600 (FIG. 6) is implemented using digital gates.

Figure 10:
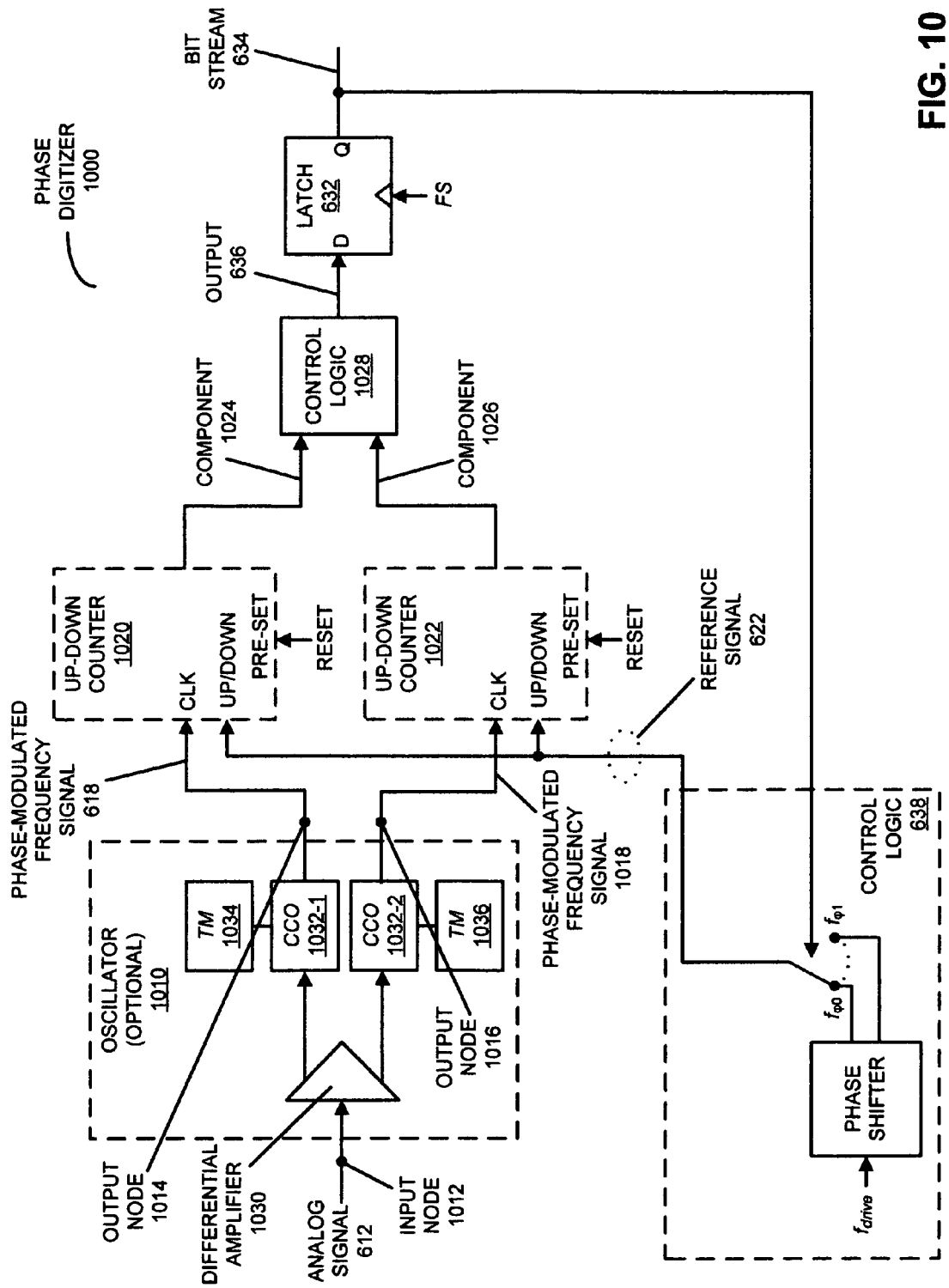
FIG. 10 is a block diagram illustrating a phase digitizer in accordance with an embodiment.

In some embodiments, the phase digitizer includes two up-down counters that are driven anti-phase (by, respectively, the phase-modulated frequency signal and an inverted version of the phase-modulated frequency signal), so that, at any given time, one of the two up-down counters counts up while the other up-down counter counts down, which may reduce or eliminate sensitivity to power-supply fluctuations. In these embodiments, the filtered demodulated phase error may be the digital difference between the states of the two up-down counters. This is shown in FIG. 10, which presents a block diagram illustrating a phase digitizer 1000. In this phase digitizer, an optional oscillator 1010 may have input node 1012 and output nodes 1014 and 1016, where output node 1014 outputs phase-modulated frequency signal 618 and output node 1016 outputs an inverted version of the phase-modulated frequency signal (i.e., phase-modulated frequency signal 1018). Moreover, the phase-domain $\Delta\Sigma$ modulator may include up-down counter 1020 electrically coupled to output node 1014 so that up-down counter 1020 is driven by phase-modulated frequency signal 618 and up-down counter 1022 electrically coupled to output node 1016 so that up-down counter 1022 is driven by phase-modulated frequency signal 1018. At a given time, up-down counter 1020 may determine and filter a component 1024 of the demodulated phase error based on phase-modulated frequency signal 618 and the selected one of the set of reference signals (such as reference signal 622), and up-down counter 1022 may determine and filter a component 1026 of the demodulated phase error based on phase-modulated frequency signal 1018 and the selected one of the set of reference signals. Then, the phase-domain $\Delta\Sigma$ modulator may combine component 1024 of the demodulated phase error and component 1026 of the demodulated phase error to determine the demodulated phase error (for example, control logic 1028 in the phase-domain $\Delta\Sigma$ modulator may calculate the digital difference of component 1024 of the demodulated phase error and component 1026 of the demodulated phase error), which may be sampled using latch 632 to provide bit stream 634. Furthermore, control logic 638 may select the reference phase of reference signal 622 based on one or more bits of bit stream 634. Thus, if the most-significant bit is used, reference signal 622 may have a given one of two reference phases, while if three bits are used, reference signal 622 may have a given one of eight reference phases, etc.

As shown in FIG. 10, optional oscillator 1010 may include differential amplifier 1030 electrically coupled to CCOs 1032, which are, respectively, electrically coupled to output nodes 1014 and 1016. Additionally, phase digitizer 1000 may include: trimming mechanisms (TM) 1034 (such as a DAC), electrically coupled to CCO 1032-1, which provides a first trim value that sets the carrier frequency of CCO 1032-1; and trimming mechanism (TM) 1036 (such as another DAC, which may store a different value than trimming mechanism 1034), electrically coupled to CCO 1032-2, which provides a second trim value that sets the carrier frequency of CCO 1032-2. Note that in some embodiments, trimming mechanisms 1034 and 1036 are combined into a single trimming mechanism that provides the first trim value to CCO 1032-1 and the second trim value to CCO 1032-2.

Figure 11:
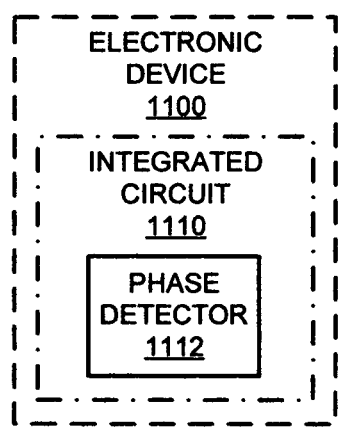
FIG. 11 is a block diagram of an electronic device that includes a phase digitizer in accordance with an embodiment.

The preceding embodiments of the phase detector may be used in a wide variety of applications, including: an integrated (on-chip) temperature sensor, a discrete temperature sensor, intra-chip communication, inter-chip communication, an integrated frequency reference, a clock source for use in one or more time domains, a radio receiver or transceiver, a multi-core processor, a server, a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, a portable electronic device (such as a personal digital assistant, an MP3 player and a cellular telephone) and/or a non-portable electronic device. As a general illustration, FIG. 11 presents a block diagram of an electronic device 1100 that includes a phase detector 1112, such as one of the preceding embodiments of the phase detector. For example, phase detector 1112 may be disposed on an integrated circuit 1110 in electronic device 1100.

While the present disclosure has been described in connection with specific embodiments, the claims are not limited to what is shown. Consequently, the preceding embodiments may include fewer components or additional components. For example, in an ETF-based temperature sensor the digital output may be compensated for by at least a single-point calibration to correct for process variations and/or other error sources. Thus, the phase detector may provide the digital value based on a calibration setting or a trim setting (such as a temperature-calibration setting), which may have been determined by comparing the digital value to a reference, and which may reduce errors in the digital value. This temperature-calibration setting may be stored in an optional storage component, such as: a non-volatile memory, an array of resistors, a memory circuit and/or a fusable link. Note that the calibration setting may be determined from the coefficients of a polynomial, which may be implemented in the digital domain. For example, a fifth-order polynomial may be used. Alternatively or additionally, a look-up table, a cubic spline and/or an interpolation technique may be used. In some embodiments, control logic 638 is external to the phase-domain $\Delta\Sigma$ modulator in FIG. 6. Thus, one or more reference signals may be generated in the phase-domain $\Delta\Sigma$ modulator or may be received by the phase-domain $\Delta\Sigma$ modulator in FIG. 6.

Moreover, two or more components in one or more of the preceding embodiments may be combined into a single component and/or a position of one or more components may be changed. For example, referring to FIG. 6, in embodiments with optional ETF 640, a higher-order $\Delta\Sigma$ modulator can be realized by applying the output of a phase DAC in control logic 638 to the input of optional ETF 640 and applying a fixed reference signal 622 (having fundamental frequency 614 and a constant reference phase) to up-down counter 620. In these embodiments, the filtering provided by optional ETF 640 may increase the order of the $\Delta\Sigma$ modulator, thereby providing even higher resolution.

Furthermore, in some embodiments, the reference phases of reference signal 622 in alternating or interleaved time intervals 624 and 628 are selected from a set of multiple reference phases (i.e., more than two reference phases). This configuration may facilitate multi-bit operation of phase digitizer 600. In these embodiments, the reference phases of reference signal 622 may be selected based on the sampled state of up-down counter 620, which acts as a digital filter (such as a digital integrator).

Note that in some embodiments phase digitizer 600 includes a digital filter after up-down counter 620, which filters the output from up-down counter 620. For example, the digital filter may include another instance of an up-down counter which is incremented or decremented by the output from up-down counter 620. These embodiments may also increase the order of the ΔΣ modulator.

In the preceding embodiments, some components are shown directly connected to one another, while others are shown connected via intermediate components. In each instance the method of interconnection, or 'coupling,' establishes some desired electrical communication between two or more circuit nodes, or terminals. Such coupling may often be accomplished using a number of circuit configurations, as will be understood by those of skill in the art, for example, AC coupling and/or DC coupling may be used.

In some embodiments, functionality in these circuits, components and devices is implemented in hardware and/or in software as is known in the art. For example, some or all of the functionality of these embodiments may be implemented in one or more: application-specific integrated circuit (ASICs), field-programmable gate array (FPGAs), and/or one or more digital signal processors (DSPs). Furthermore, the circuits and components may be implemented using bipolar, PMOS and/or NMOS gates or transistors, and signals in these embodiments may include digital signals that have approximately discrete values and/or analog signals that have continuous values. Thus, the drive signal in FIG. 6 may be a continuous signal or a pulsed signal (such as a signal with pulses at edges that correspond to $f_{drive}$). Additionally, components and circuits may be single-ended or differential, and power supplies may be unipolar or bipolar. Note that digital circuits in the phase detector may be operated synchronously (using a clocking signal) or asynchronously.

Furthermore, while the implementation of the ETF in the preceding embodiments was illustrated using a semiconductor substrate (such as silicon), a wide variety of materials with a temperature-dependent thermal diffusivity (such as a ceramic or a plastic) can be used in other embodiments. Alternatively or additionally, the underlying principle of the device may be applied to other physical phenomenon in addition to or separate from the temperature-dependent thermal diffusivity of the semiconductor or the material in the ETF. For example, using a suitable plastic substrate, hydroscopic effects (such as those associated with relative-humidity changes) or adhesion of a chemical (such as a gas or a compound that reacts with the material) may be used to modify the thermal diffusivity of one or more ETFs in a predefined or predetermined manner. This can form the basis of a closed-loop compensated circuit (such as an EFLL) and, thus, a sensor for the other physical phenomenon.

More generally, the phase detector may be used to digitize the phase of an analog signal in a wide variety of applications, including applications other than those based on an ETF. Thus, the embodiments of the phase detector are not limited to temperature sensing, but are suited to sensing other signals generated by other systems and/or sensors for which the phase behaviour is of interest (e.g., thermal-conductivity-based gas sensors).

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in: Caltech Intermediate Format (CIF), Calma GDS II Stream Format (GDSII) or Electronic Design Interchange Format (EDIF). Those of skill in the art of integrated circuit design can develop such data structures from schematic diagrams of the type detailed above and the corresponding descriptions and encode the data structures on a computer-readable medium. Those of skill in the art of integrated circuit fabrication can use such encoded data to fabricate integrated circuits comprising one or more of the circuits described herein.

Figure 12:
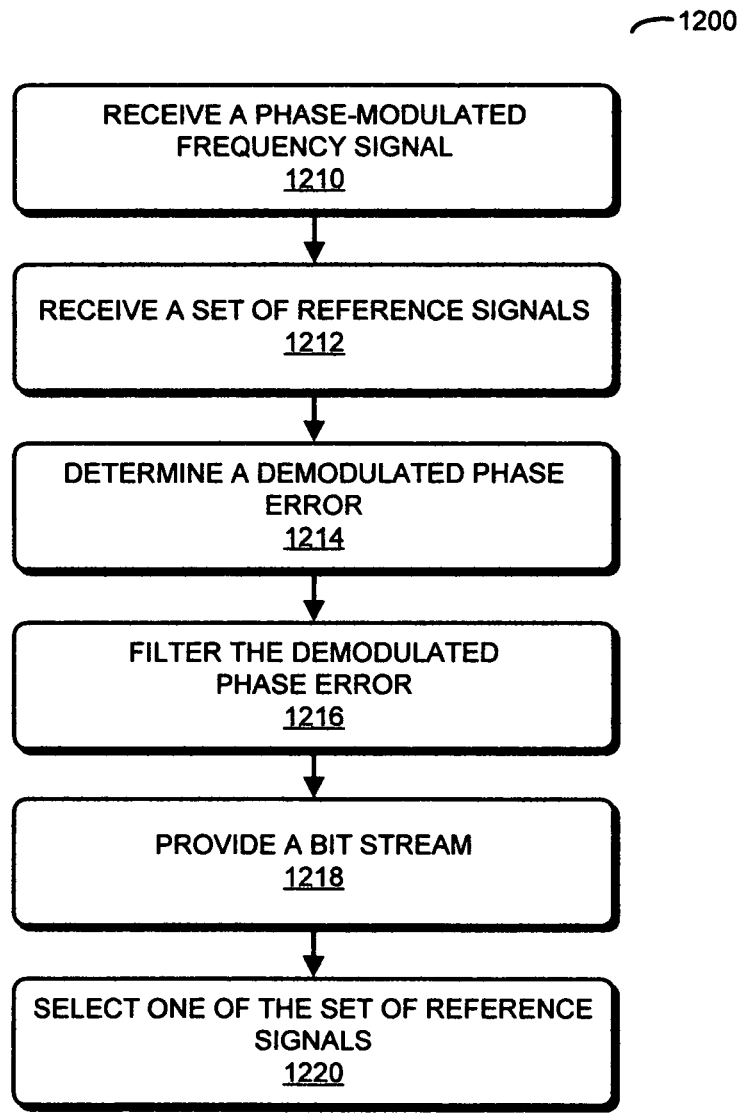
FIG. 12 is a flow chart illustrating a method for digitizing a phase using a phase digitizer in accordance with an embodiment.

We now describe embodiments of the method. FIG. 12 presents a flow chart illustrating a method 1200 for digitizing a phase using a phase detector, such as one of the preceding embodiments of the phase detector. During operation, the phase detector receives a phase-modulated frequency signal (operation 1210) having a carrier frequency modulated with a fundamental frequency and an associated phase. Moreover, the phase detector receives a set of reference signals (operation 1212), where the set of reference signals have the fundamental frequency, and a given reference signal has an associated reference phase. Then, a phase-domain delta-sigma (ΔΣ) modulator in the phase detector determines a demodulated phase error (operation 1214) based on the phase-modulated frequency signal and a selected one of the set of reference signals, where the demodulated phase error represents a difference between the phase and a reference phase of the selected one of the set of reference signals. Furthermore, a digital filter in the phase-domain ΔΣ modulator filters the demodulated phase error (operation 1216). Next, a latch in the phase-domain ΔΣ modulator provides a bit stream (operation 1218) by sampling one or more bits of the filtered demodulated phase error, where an average value of the bit stream represents the phase. Additionally, control logic in the phase-domain ΔΣ modulator selects the one of the set of reference signals (operation 1220) based on the bit stream.

In some embodiments, method 1200 includes additional or fewer operations. Moreover, the order of the operations may be changed and/or two or more operations may be combined into a single operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. Therefore, the spirit and scope of the appended claims should not be limited to the foregoing description. Only those claims specifically reciting "means for" or "step for" should be construed in the manner required under the sixth paragraph of 35 U.S.C. §112.

What is claimed:

1. A phase digitizer, comprising:
a first input node configured to receive a phase-modulated frequency signal having a carrier frequency modulated with a fundamental frequency and an associated phase, wherein the carrier frequency is greater than the fundamental frequency;
a phase-domain delta-sigma (ΔΣ) modulator, electrically coupled to the input node, configured to:
receive the phase-modulated frequency signal and a set of reference signals, wherein the set of reference signals have the fundamental frequency, and wherein a given reference signal has an associated reference phase;
determine a demodulated phase error based on the phase-modulated frequency signal and a selected one of the set of reference signals, wherein the demodulated phase error represents a difference between the phase and a reference phase of the selected one of the set of reference signals;
filter the demodulated phase error using a digital filter in the phase-domain ΔΣ modulator;
provide a bit stream by sampling one or more bits of the filtered demodulated phase error using a latch in the phase-domain ΔΣ modulator, wherein an average value of the bit stream represents the phase; and
select the one of the set of reference signals based on the bit stream using control logic in the phase-domain ΔΣ modulator.

2. The phase digitizer of claim 1, wherein the phase digitizer includes an oscillator that has a second input node and an output node, which is electrically coupled to the first input node;
wherein the second input node is configured to receive an analog signal having the fundamental frequency and the phase; and
wherein the oscillator is configured to output, on the output node, the phase-modulated frequency signal that represents amplitude variations in the analog signal as frequency variations.

3. The phase digitizer of claim 2, wherein the oscillator includes:
an amplifier, electrically coupled to the second input node, configured to receive and amplify the analog signal; and
a current-controlled oscillator (CCO), electrically coupled to the amplifier, configured to convert the analog signal into the phase-modulated frequency signal and to output the phase-modulated frequency signal on the output node.

4. The phase digitizer of claim 3, wherein the phase digitizer further comprises a trimming mechanism, electrically coupled to the CCO, configured to provide a trim value that sets the carrier frequency of the CCO.

5. The phase digitizer of claim 2, wherein the oscillator has the output node and a second output node;
wherein the output node is configured to output the phase-modulated frequency signal and the second output node is configured to output an inverted version of the phase-modulated frequency signal;
wherein the phase-domain ΔΣ modulator includes a first up-down counter electrically coupled to the output node so that the first up-down counter is driven by the phase-modulated frequency signal and a second up-down counter electrically coupled to the second output node so that the second up-down counter is driven by the inverted version of the phase-modulated frequency signal;
wherein, at a given time, the first up-down counter is configured to determine and filter a first component of the demodulated phase error based on the phase-modulated frequency signal and the selected one of the set of reference signals, and second up-down counter is configured to determine and filter a second component of the demodulated phase error based on the inverted version of the phase-modulated frequency signal and the selected one of the set of reference signals; and
wherein the phase-domain ΔΣ modulator is configured to combine the first component of the demodulated phase error and the second component of the demodulated phase error to determine the demodulated phase error, which is then sampled using the latch to provide the bit stream.

6. The phase digitizer of claim 5, wherein the oscillator includes a differential amplifier electrically coupled to two CCOs, which are, respectively, electrically coupled to the output node and the second output node.

7. The phase digitizer of claim 6, wherein the phase digitizer further comprises:
a first trimming mechanism, electrically coupled to a first of the CCOs, configured to provide a first trim value that sets the carrier frequency of the first of the CCOs; and
a second trimming mechanism, electrically coupled to a second of the CCOs, configured to provide a second trim value that sets the carrier frequency of the second of the CCOs.

8. The phase digitizer of claim 2, wherein, during a calibration operation, a calibration phase-modulated frequency signal having the carrier frequency and modulated by a signal having the fundamental frequency and a predefined phase is input to the phase digitizer to determine a phase delay of the oscillator; and
wherein, during normal operation of the phase digitizer, the control logic subtracts the phase delay from the average value of the bit stream.

9. The phase digitizer of claim 1, wherein the phase-domain ΔΣ modulator includes an up-down counter; and
wherein the up-down counter is configured to increment and decrement a counter value of the up-down counter based on the phase-modulated frequency signal and the selected one of the set of reference signals.

10. The phase digitizer of claim 9, wherein, after one cycle, the counter value accumulated by the up-down counter is proportional to the filtered demodulated phase error.

11. The phase digitizer of claim 1, wherein the one or more bits of the filtered demodulated phase error that are sampled by the latch include one of: a most-significant bit of the up-down counter, and multiple bits of the up-down counter.

12. The phase digitizer of claim 1, wherein the control logic has a coarse operating mode and a fine operating mode;
wherein, during the coarse operating mode, there is a first difference between first and second reference phases of first and second reference signals in the set of reference signals, which are at different times the selected one of the set of reference signals, and a first estimate of the phase having a first precision is determined using the phase digitizer;
wherein, during the fine operating mode, there is a second difference between third and fourth reference phases of third and fourth reference signals in the set of reference signals, which are at different times the selected one of the set of reference signals, and a second estimate of the phase having a second precision is determined using the phase digitizer;
wherein the second difference is less than the first difference;
wherein the third and fourth reference phases bracket the phase; and
wherein the first precision is less than the second precision.

13. The phase digitizer of claim 1, wherein the reference signals in the set of reference signals include square waves.

14. The phase digitizer of claim 1, wherein the demodulated phase error includes a square wave.

15. A system, comprising a phase digitizer, wherein the phase digitizer includes:
a first input node configured to receive a phase-modulated frequency signal having a carrier frequency modulated with a fundamental frequency and an associated phase, wherein the carrier frequency is greater than the fundamental frequency;
a phase-domain delta-sigma (ΔΣ) modulator, electrically coupled to the input node, configured to:

receive the phase-modulated frequency signal and a set of reference signals, wherein the set of reference signals have the fundamental frequency, and wherein a given reference signal has an associated reference phase;

determine a demodulated phase error based on the phase-modulated frequency signal and a selected one of the set of reference signals, wherein the demodulated phase error represents a difference between the phase and a reference phase of the selected one of the set of reference signals;

filter the demodulated phase error using a digital filter in the phase-domain $\Delta\Sigma$ modulator;

provide a bit stream by sampling one or more bits of the filtered demodulated phase error using a latch in the phase-domain $\Delta\Sigma$ modulator, wherein an average value of the bit stream represents the phase; and select the one of the set of reference signals based on the bit stream using control logic in the phase-domain $\Delta\Sigma$ modulator.

16. The system of claim 15, wherein the phase digitizer includes an oscillator that has a second input node and an output node, which is electrically coupled to the first input node;

wherein the second input node is configured to receive an analog signal having the fundamental frequency and the phase; and wherein the oscillator is configured to output, on the output node, the phase-modulated frequency signal that represents amplitude variations in the analog signal as frequency variations.

17. The system of claim 16, wherein the oscillator includes:

an amplifier, electrically coupled to the second input node, configured to receive and amplify the analog signal; and a current-controlled oscillator (CCO), electrically coupled to the amplifier, configured to convert the analog signal into the phase-modulated frequency signal and to output the phase-modulated frequency signal on the output node.

18. The system of claim 16, wherein the oscillator has the output node and a second output node;

wherein the output node is configured to output the phase-modulated frequency signal and the second output node is configured to output an inverted version of the phase-modulated frequency signal;

wherein the phase-domain $\Delta\Sigma$ modulator includes a first up-down counter electrically coupled to the output node so that the first up-down counter is driven by the phase-modulated frequency signal and a second up-down counter electrically coupled to the second output node so that the second up-down counter is driven by the inverted version of the phase-modulated frequency signal;

wherein, at a given time, the first up-down counter is configured to determine and filter a first component of the demodulated phase error based on the phase-modulated frequency signal and the selected one of the set of reference signals, and second up-down counter is configured to determine and filter a second component of the demodulated phase error based on the inverted version of the phase-modulated frequency signal and the selected one of the set of reference signals; and wherein the phase-domain $\Delta\Sigma$ modulator is configured to combine the first component of the demodulated phase error and the second component of the demodulated phase error to determine the demodulated phase error, which is then sampled using the latch to provide the bit stream.

19. The system of claim 15, wherein the phase-domain $\Delta\Sigma$ modulator includes an up-down counter; and wherein the up-down counter is configured to increment and decrement a counter value of the up-down counter based on the phase-modulated frequency signal and the selected one of the set of reference signals.

20. A method for phase digitizing a phase, comprising:

receiving a phase-modulated frequency signal having a carrier frequency modulated with a fundamental frequency and an associated phase, wherein the carrier frequency is greater than the fundamental frequency;

receiving a set of reference signals, wherein the set of reference signals have the fundamental frequency, and wherein a given reference signal has an associated reference phase;

using a phase-domain delta-sigma ($\Delta\Sigma$) modulator in a phase detector:

determining a demodulated phase error based on the phase-modulated frequency signal and a selected one of the set of reference signals, wherein the demodulated phase error represents a difference between the phase and a reference phase of the selected one of the set of reference signals;

filtering the demodulated phase error using a digital filter in the phase-domain $\Delta\Sigma$ modulator;

providing a bit stream by sampling one or more bits of the filtered demodulated phase error using a latch in the phase-domain $\Delta\Sigma$ modulator, wherein an average value of the bit stream represents the phase; and selecting the one of the set of reference signals based on the bit stream using control logic in the phase-domain $\Delta\Sigma$ modulator.

\* \* \* \* \*